(12) United States Patent
Cooper

(10) Patent No.: US 6,614,368 B1
(45) Date of Patent: Sep. 2, 2003

(54) DATA COMPRESSION METHOD AND APPARATUS UTILIZING CASCADED CHARACTER TABLES

(75) Inventor: Albert B. Cooper, New York, NY (US)

(73) Assignee: Unisys Corporation, Blue Bell, PA (US)

(*) Notice: Subject to any disclaimer, the term of this patent is extended or adjusted under 35 U.S.C. 154(b) by 27 days.

(21) Appl. No.: 10/050,357

(22) Filed: Jan. 16, 2002

(51) Int. Cl.⁷ ................................................ H03M 7/34
(52) U.S. Cl. .......................... 341/51; 341/57; 341/95; 341/106
(58) Field of Search .......................... 341/51, 57, 95, 341/106

(56) References Cited

U.S. PATENT DOCUMENTS

| | | | | |
|---|---|---|---|---|
| 4,814,746 A | * | 3/1989 | Miller et al. | 341/95 |
| 5,179,378 A | * | 1/1993 | Ranganathan et al. | 341/51 |
| 5,293,164 A | * | 3/1994 | Bugajski et al. | 341/51 |
| 5,442,350 A | * | 8/1995 | Iyer et al. | 341/51 |
| 5,642,112 A | * | 6/1997 | Cooper | 341/51 |
| 5,838,264 A | * | 11/1998 | Cooper | 341/106 |
| 5,861,827 A | * | 1/1999 | Welch et al. | 341/51 |
| 6,018,303 A | * | 1/2000 | Sadeh | 341/51 |

OTHER PUBLICATIONS

Ming–Bo Lin; *Journal of VLSI Signal Processing Systems for Signal, Image, and Video Technology*; "A Hardware Architecture for the LZW Compression and Decompression Algorithms Based on Parallel Dictionaries"; pp. 369–381; (Kluwer Academic Publihsers, vol. 26, No. 3, Nov. 2000).

K.S. Ng, et al; *Proceedigns of the 4th International Conference on Document Analysis and Recognition* (ICDAR; "Dynamic Word Based Text Compression", pp. 412–416, (Proceedings of the ICDAR, Los Alamitos, IEEE Comp. Soc, US, vol. II. Aug. 18, 1997).

* cited by examiner

Primary Examiner—Michael Tokar
Assistant Examiner—Linh V Nguyen
(74) Attorney, Agent, or Firm—Michael B. Atlass; Albert B. Cooper; Mark T. Starr (57) ABSTRACT

The data compressor utilizes a plurality of character tables arranged in levels for storing strings of data characters, the character tables corresponding to respective characters of the alphabet. A string is stored by storing the string code associated with the string in a character table corresponding to the extension character of the string in a location of the character table corresponding to the code of the string prefix. The character tables at the first level store 2-character strings and the character tables at a subsequent level store strings that are one character longer than the strings stored in the character tables at the level prior thereto.

39 Claims, 7 Drawing Sheets

DATA COMPRESSION METHOD AND APPARATUS UTILIZING CASCADED CHARACTER TABLES

CROSS REFERENCE TO RELATED APPLICATIONS

U.S. patent application Ser. No. 09/855,127 "Character Table Implemented Data Compression Method And Apparatus" by Cooper, filed May 14, 2001, discloses a character table implementation for LZ dictionary type compressors.

U.S. patent application Ser. No. 09/951,263 "Data Compression Method And Apparatus Utilizing Cascaded Subdictionaries" by Cooper, filed Sep. 13, 2001 discloses a cascaded subdictionary arrangement for implementing LZ type compressors.

Said Ser. No. 09/855,127 and Ser. No. 09/951,263 are incorporated herein by reference.

BACKGROUND OF THE INVENTION

1. Field of the Invention

The invention relates to LZ dictionary based data compression systems particularly with respect to the LZW compression methodology. More particularly, the invention relates to the architecture and protocols for storing and accessing data character strings in the compressor in parallel arrangements.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW, adopted as the standard for V.42 bis modem compression and decompression, is described in U.S. Pat. No. 4,558,302 by Welch, issued Dec. 10, 1985. LZW has been adopted as the compression and decompression standard used in the GIF image communication protocol and is utilized in the TIFF image communication protocol. GIF is a development of CompuServe Incorporated and the name GIF is a Service Mark thereof. A reference to the GIF specification is found in GRAPHICS INTERCHANGE FORMAT, Version 89a, Jul. 31, 1990. TIFF is a development of Aldus Corporation and the name TIFF is a Trademark thereof. Reference to the TIFF specification is found in TIFF, Revision 6.0, Final—Jun. 3, 1992.

Further examples of LZ dictionary based compression and decompression systems are described in the following U.S. patents: U.S. Pat. No. 4,464,650 by Eastman et al., issued Aug. 7, 1984; U.S. Pat. No. 4,814,746 by Miller et al., issued Mar. 21, 1989; U.S. Pat. No. 4,876,541 by Storer, issued Oct. 24, 1989; U.S. Pat. No. 5,153,591 by Clark, issued Oct. 6, 1992; U.S. Pat. No. 5,373,290 by Lempel et al., issued Dec. 13, 1994; U.S. Pat. No. 5,838,264 by Cooper, issued Nov. 17, 1998; U.S. Pat. No. 5,861,827 by Welch et al., issued Jan. 19, 1999; and U.S. Pat. No. 6,188,333 by Cooper, issued Feb. 13, 2001.

In dictionary based LZ compression and decompression systems, the compressor and decompressor dictionaries may be initialized with all of the single character strings of the character alphabet. In some implementations, the single character strings are considered as recognized although not explicitly stored. In such systems the value of the single character may be utilized as its code and the first available code utilized for multiple character strings would have a value greater than the single character values. In this way the decompressor can distinguish between a single character string and a multiple character string and recover the characters thereof. For example, in the ASCII environment, the alphabet has an 8 bit character size supporting an alphabet of 256 characters. Thus, the characters have values of 0–255. The first available multiple character string code can, for example, be 258 where the codes 256 and 257 are utilized as control codes as is well known.

In the prior art dictionary based LZ compression systems, data character strings are stored and accessed in the compressor dictionary utilizing well known search tree architectures and protocols. Typically, the search for the longest matching string stored in the dictionary is an iterative process where sequentially matched strings in the dictionary are extended by sequentially fetched input characters, respectively, until the longest matching string is determined. At each iteration, the dictionary is accessed to determine if the new string extension is a previously stored dictionary entry. Potentially, at each iteration, access to all of the strings stored in the dictionary may be effected to determine the required information. For example, in systems implemented utilizing an associative memory dictionary, such as in said U.S. Pat. Nos. 5,373,290 and 5,838,264, it may be necessary, at an iteration, to access all dictionary locations to determine that an extended string is noted stored therein. The iterative protocols, therefore, tend to be time consuming.

The searchtree is typically arranged in nodes where each node represents a character, and a string of characters is represented by a node-to-node path through the tree. When the input character stream has been matched in the dictionary tree up to a matched node, a next input character is fetched to determine if the string match will continue. Conventionally, a determination is made to ascertain if the fetched character is already stored as an extension node of the matched node. Various techniques are utilized to effect this determination such as hashing and sibling lists as are well understood in the art.

Although the known dictionary architectures and protocols provide efficient data compression systems, it is a continuing objective in the art to improve compressor performance.

The compressor of said Ser. No. 09/855,127 utilizes a new string storage and access architecture and protocols involving character tables which, it is believed, will improve the performance of LZ type data compression algorithms. The compressors of said Ser. No. 09/951,263 utilizes a new string storage and access architecture and protocols involving cascaded subdictionaries which, it is believed, will improve the speed of dictionary based LZ type data compressors. It is a further objective of the present invention to combine the technologies of said Ser. No. 09/855,127 and Ser. No. 09/951,263 to synergistically obtain the advantages of both.

SUMMARY OF THE INVENTION

The present invention provides a new string storage and access architecture and protocols which, it is believed, will further improve the performance of dictionary based LZ type data compressors.

In the present invention, a plurality of character tables, corresponding to respective characters of the alphabet, are arranged in levels for storing strings of data characters encountered in the input stream. The strings stored in the character tables of a level have the same number of characters with respect to each other and the strings stored in the character tables of a level have one character more than the strings stored in the character tables of the level prior thereto. A string is stored in a character table by storing the string code associated with the string in a character table corresponding to the extension character of the string at a character table location corresponding to the code of the string prefix. A plurality of data characters are fetched from the input and applied to the levels, respectively. The fetched characters are searched by comparing the fetched characters to the stored strings to determine the longest match therewith. The longest match is determined by one of the fetched characters resulting in a mismatch at one of the levels. The string code associated with the longest match is output so as to provide the output stream of compressed codes corresponding to the input stream of data characters. An extended string comprising the longest match extended by the fetched character that resulted in the mismatch is stored at the mismatching level in the character table corresponding to the mismatching character.

DESCRIPTION OF THE PREFERRED EMBODIMENTS

The best mode embodiments described below are predicated, generally, on the LZW methodology. The embodiments conveniently utilize an implementation feature similar to that described above where the single character strings are considered as recognized by the compressor although not explicitly initialized therein. It is appreciated that the invention may be embodied with alternative implementation features such as a non-initialized arrangement as well as a configuration where the compressor is explicitly initialized with all of the single character strings.

Figure 1:
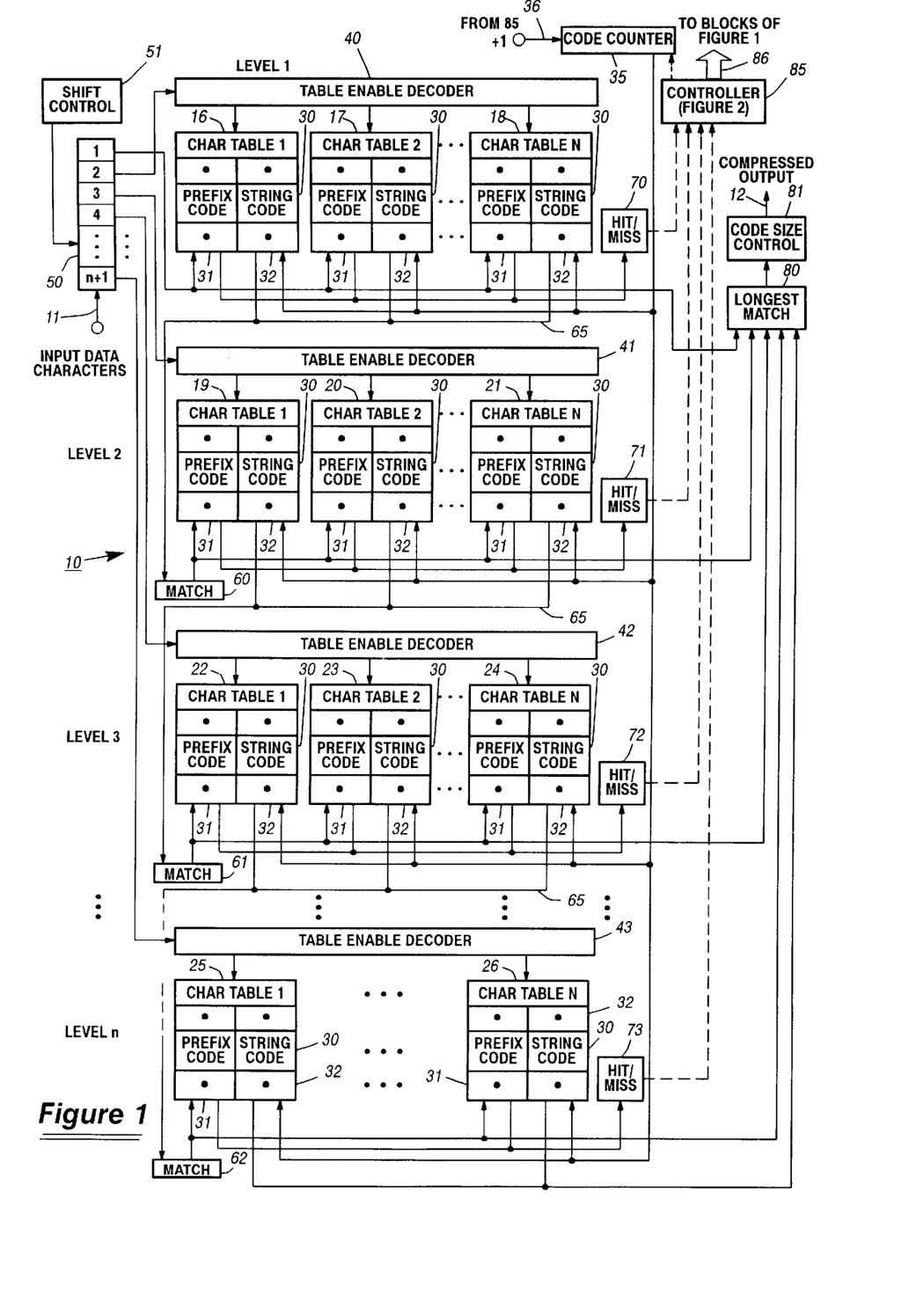
FIG. 1 is a schematic block diagram of a data compressor for compressing data in accordance with a best mode embodiment of the present invention.

Referring to FIG. 1, a data compressor 10 is illustrated that compresses a stream of input data characters applied at an input 11 into a stream of corresponding compressed codes at an output 12. The compressor 10 is arranged in levels denoted as levels 1 to n. Each of the levels includes character tables corresponding to the respective data characters of the alphabet over which compression is being performed. The character tables illustrated on level 1 are denoted as character tables 16–18, on level 2 as character tables 19–21, on level 3 as character tables 22–24 and on level n as character tables 25 and 26. Each of the character tables 16–26 is comprised of a plurality of table locations 30 for storing strings of data characters encountered at the input 11. Each character table location 30 is comprised of a prefix code field 31 and a string code field 32.

A data character string is comprised of a prefix string of one or more characters followed by an extension character. The string is identified by a string code associated therewith. A string is stored in a character table by storing the string code associated with the string in a character table corresponding to the extension character of the string at a character table location corresponding to the code of the string prefix. In the embodiment of FIG. 1, the prefix code and string code are stored in the prefix code field 31 and string code field 32, respectively, of a location 30 of a character table corresponding to the string extension character. The stored prefix codes provide a prefix code list 31 with which to index and access the corresponding string codes 32. The string code assigned to a stored string is provided from a code counter 35 which is incremented by 1 via an input 36.

By the operations of the compressor 10 to be described, the character tables of levels 1-n will store exclusively 2, 3, 4, . . . , and n+1 character strings, respectively. Accordingly, it will be appreciated that the prefix code lists 31 of the character tables 16–18 of level 1 will store only single character string codes while the prefix code lists 31 of the character tables 19–26 of levels 2-n will store only multiple character string codes.

In typical LZW data compressors, the maximum multiple character string code is selected as 4095 and when in the ASCII environment, for example, the alphabet is comprised of 256 data characters having values of 0–255. The first available multiple string code may, for example, be 258 where the codes 256 and 257 are utilized as control codes. When these limitations are applied to the described embodiments, the prefix code indices 31 of character tables 16–18 may range from 0 through 255 while the prefix code indices 31 of the character tables 19–26 may range from 258 through 4095.

Included at levels 1 to n are respective table enable decodes 40–43. Each of the table enable decoders 40–43 enables, thereby selecting, one of the character tables at the associated level in accordance with a character applied at the decoder input. The table enable decoder enables the character table corresponding to the applied character. The selected character table is enabled for reading and writing.

The compressor 10 includes an input character buffer 50 for holding n+1 consecutive characters from the input 11. Accordingly, the stages of the buffer 50 are denoted as 1 to n+1. The first stage of the buffer 50 is coupled to the prefix code lists 31 of the character tables 16–18 of level 1. The stages 2 to n+1 of the buffer 50 are coupled to the table enable decoders 40–43 of levels 1 to n, respectively. A shift control circuit 51 controls shifting of the buffer 50 so that new input characters are fetched into the n+1 stage while processed characters are discarded from the first stage.

Included at levels 2 to n are respective match registers 60–62. The match registers 60–62 are utilized to determine if the code in the match register is contained in the prefix code list 31 of the enabled character table at the associated level. The code in the register is utilized to perform a look-up in the enabled character table to locate a matching prefix code in the prefix code list 31 thereof so as to access and provide the corresponding string code in the field 32. At level 1, the character value in the first stage of the buffer 50 is utilized to determine if this single character string code is contained in the prefix code list 31 of the enabled character table of level 1. The character value in the first stage of buffer 50 is utilized to perform a look-up in the enabled character table of level 1 to locate a matching prefix code in the prefix code list 31 thereof so as to access and provide the corresponding string code in the field 32.

The accessed string code from the field 32 of the enabled character table of level 1 is cascaded into the match register 60. In a similar manner, the accessed string code from the field 32 of the enabled character table of level 2 is cascaded into the match register 61. The cascading continues from the accessed string code field 32 of the enabled character table of level 3, through the intervening levels, to the match register 62 of level n. The cascading is implemented by paths 65.

A hit/miss circuit 70 is coupled to the character tables 16–18 of level 1 to provide a "hit" signal if the character value in stage 1 of the input buffer 50 is stored in the prefix code list 31 of the enabled character table. A "miss" signal is provided if the character value is not in the prefix code list 31 of the enabled character table. While the prefix code list 31 of the enabled character table 16–18 is being searched pending the hit or the miss, neither signal is provided. In this manner the hit/miss circuit 70 provides a definite indication when the determination is made that the 2 character string comprising the character in stage 1 of buffer 50 extended by the character corresponding to the enabled character table 16–18 is or is not stored therein.

At level 2, a similar hit/miss circuit 71 is coupled to the character tables 19–21. In the manner described above the respect to hit/miss circuit 70, the hit/miss circuit 71 provides the "hit" signal when the code in the match register 60 matches a code in the prefix code list 31 of the enabled character table 19–21. The "miss" signal is provided by the circuit 71 when the determination is made that the code in the register 60 is not in the prefix code list 31 of the enabled character table. In this manner the his/miss circuit 71 provides a definite indication when the determination is made that the multiple character string comprising the code in the match register 60 extended by the character corresponding to the enabled character table 19–21 is or is not stored therein. The levels 3 to n include similar respective hit/miss circuits, such as the circuits 72 and 73, where the descriptions given with respect to the hit/miss circuit 71 of level 2 also apply thereto.

An extended string is stored in the enabled character table 16–18 of level 1 by storing the value of the character in the firs stage of buffer 50 into the prefix code list 31 at a next available location in the enabled character table. A string code is assigned to the extended string by storing the code from the code counter 35 into the string code field 32 of this next available location. The code counter 35 is then advanced to the next available string code. In a similar manner, an extended string is stored in an enabled character table of levels 2 to n by storing the code in the associated match register into the prefix code list 31 at the next available location in the enabled character table. The string code is assigned as described with respect to level 1.

By operations to be described, the compressor 10 determines the longest match of the n+1 characters in the buffer 50 with the strings stored in the character table 16–26. The appropriate code of the determined longest match is transferred to a longest match register 80. The code of the longest match is selectively provided from either the first stage of the buffer 50, one of the match registers 60–62 of levels 2 to n, or the string code field 32 of the character table location accessed by the code in the match register 62 of the enabled character table of level n. A code size control circuit 81 is utilized, in a well known manner, to control the number of bits used for transmitting the compressed code from the output 12.

The compressor 10 includes a controller 85 for controlling the functions to be performed. The controller 85 receives control inputs (denoted by dashed lines) from the code counter 35 and the hit/miss circuits 70–73 and provides control signals to all of the blocks of FIG. 1 as depicted by an arrow 86. Further details of the controller 85 are illustrated in FIG. 2.

Figure 2:
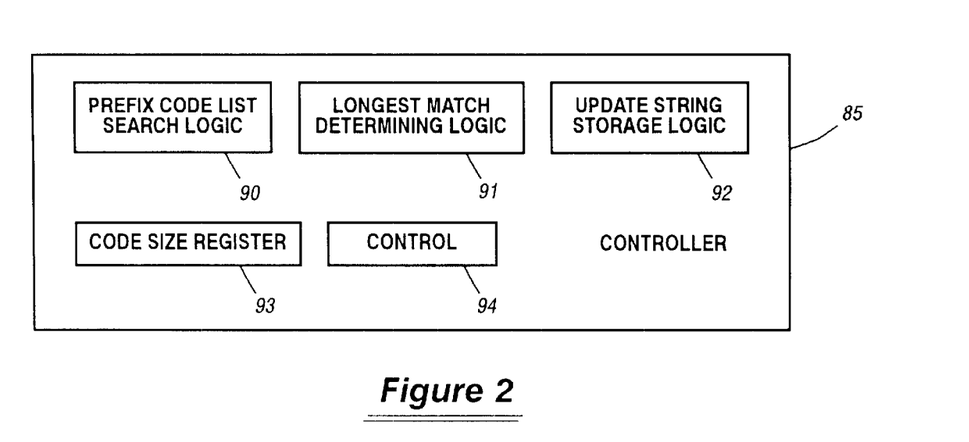
FIG. 2 is a schematic block diagram illustrating details of the controller of the embodiment of FIG. 1.

Referring to FIG. 2, with continued reference to FIG. 1, the controller 85 includes prefix code list search logic 90, longest match determining logic 91 and update string storage logic 92.

The prefix code list search logic 90 is utilized by the controller 85 to determine if the character value in the first stage of the buffer 50 is in the prefix code list 31 of the enabled character table of level 1. If so, the hit/miss circuit 70 provides the "hit" signal and if not, the hit/miss circuit 70 provides the "miss" signal. In a similar manner, the logic 90 is utilized to determine if codes in the match registers 60–62 are in the prefix code lists 31 of the enabled character tables of levels 2-n, respectively. Depending on the result of the determinations, the appropriate "hit" or "miss" signals are provided by the associated hit/miss circuits 71–73.

The longest match determining logic 91 examines the status of the hit/miss circuits 70–73. A mismatching level is determined when a hit/miss circuit at a level provides the "miss" signal while all of the hit/miss circuits at the prior levels are providing the "hit" signal. The level at which the hit/miss circuit provides the "miss" signal is the mismatching level. The code held in the match register 60–62 at the mismatching level is the code of the longest match and this code is transferred to the longest match register 80. The character applied from the input buffer 50 to the table enable decoder 40–43 of the mismatching level is the mismatching character that "broke" the match.

If the hit/miss circuit 70 indicates the "miss" signal, the code of the longest match is taken from the first stage of the input buffer 50.

If all of the hit/miss circuits 70–73 provide the "hit" signal, the code of the longest match is taken from the string code field 32 of the enabled character table of level n at the character table location containing the prefix code matching the code held in the register 62.

The update string storage logic 92 is utilized to store the appropriate extended string in the appropriate enabled character table of the mismatching level. At the mismatching level 2-n, the code held in the corresponding match register 60–62 is added to the prefix code list 31 of the enabled associated character table at a new available table location. If level 1 is the mismatching level, the single character value from the first stage of the input buffer 50 is added to the prefix code list 31 of the enabled character table of level 1 at a next available table location.

The string code from the code counter 35 for the extended string is provided to and stored in the string code field 32 of this next available table location in the enabled character table at the mismatching level. The code counter 35 is advanced to the next available string code.

The controller 85 further includes a code size register 93 for determining the code size utilized by the code size control 81 for transmitting the compressed codes on the output 12. The code size in the code size register 93 is set in accordance with the count in the code counter 35 in a well known manner. The code size is set to an initial value and incremented at predetermined codes of the code counter 35 until a maximum code size is attained. For example, in an ASCII variable length code implementation, the code size may being with 9 bits and sequentially increase to 10, 11 and 12 bits at codes 512, 1024 and 2048, respectively. It is appreciated that a fixed code size may also be utilized with appropriate modifications to the embodiment.

The controller 85 also includes control circuit 94 for controlling the detailed operations to be executed by the compressor 10. The control circuit 94 is considered as containing appropriate circuitry, such as state machines, or appropriate software, to control execution of the operations.

Figure 3:
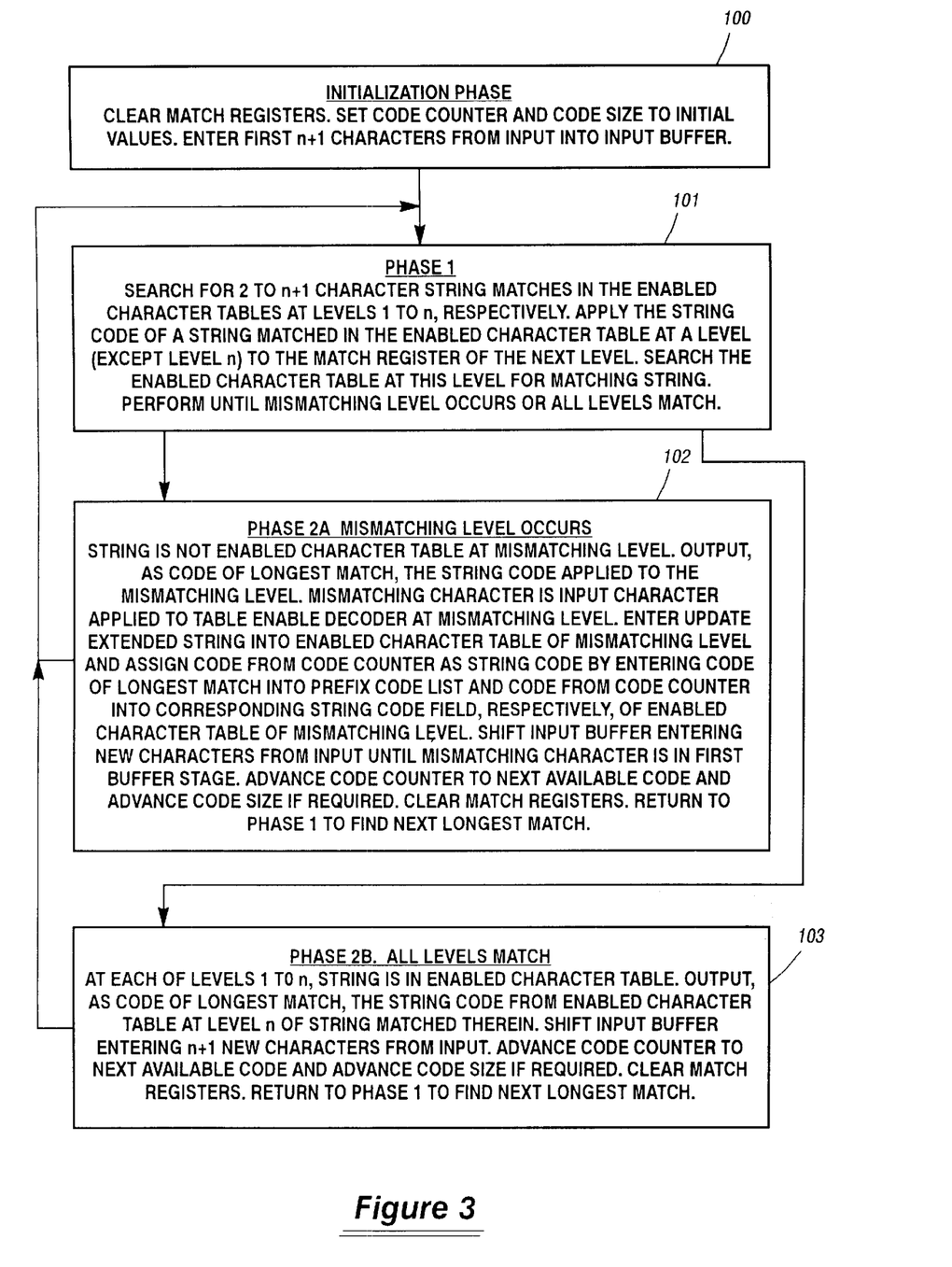
FIG. 3 is a chart summarizing the functions and illustrating the operational flow of the FIG. 1 embodiment.

Referring to FIG. 3, with continued reference to FIGS. 1 and 2, a summary and flow diagram of the operations performed by the compressor 10 is illustrated. The operations are described in terms of an initialization phase and repetitive operational phases 1 and 2. The initialization phase is denoted by a block 100, phase 1 by a block 101 and phase 2 by blocks 102 and 103.

At initialization phase block 100, the match registers 60–62 of levels 2 to n are cleared. Additionally, at the block 100, the code counter 35 and the code size register 93 are set to initial values. For example, in an ASCII environment, the code counter 35 may be set to a first available code of 258 and the code size register 93 may be set to an initial code size of 9 bits.

Further, at the block 100, the first n+1 characters from the input 11 are entered into the input buffer 50 with the first character of the input stream residing in the first stage of the buffer. Although serial data entry is illustrated, parallel data entry into the n+1 stages of the buffer 50 may alternatively be utilized. It is appreciated that the clearing, setting and data entering operations of the block 100 may be simultaneously performed.

During each iteration of the compressor 10, the operations of phases 1 and 2 determine the longest string in the buffer 50 that matches a string stored in the character tables 16–26 of levels 1 to n. The code of the longest match is provided at the compressed output 12 and the input buffer 50 is shifted, in preparation for the next longest match search iteration, so that the mismatching character resides in the first stage thereof. New characters from the input 11 are entered at stage n+1 to replace the already processed characters.

At the beginning of each iteration of the compressor 10, processing enters the phase 1 block 101. The table enable decoders 40–43 enable respective character tables corresponding to the characters in the 2 to n+1 stages of the input buffer 50 at the levels 1–n, respectively. At the block 101, a search is performed for 2 to n+1 character string matches in the enabled character tables at the levels 1 to n, respectively.

Thus, at the block 101, an enabled character table is searched, utilizing the logic 90, for the data character string represented by the prefix code applied to the prefix code list 31 of the enabled table extended by the character corresponding to the enabled table. At level 1, the prefix code is provided from the first stage of the buffer 50 and at levels 2-n the prefix code is provided by the match registers 60–62, respectively. The search may be performed by table look-up, as described above, in the prefix code list 31 of the enabled table. If the searched for string is stored in the enabled character table, the "hit" signal is provided by the associated hit/miss circuit. If the string is not stored therein, the "miss" signal is indicated.

Further, at the phase 1 block 101, the string code from the string code field 32 of a string matched at a level (except level n) is applied to the match register of the next level and the enabled character table at this level is searched for a matching string. Thus, at the block 101, the string codes of strings matched at the respective levels are cascaded for matching in the enabled character tables of the next lower levels until a mismatching level occurs or all levels match.

Specifically, the string code from the string code field 32 of a data character string match location in the enabled character table of level 1 is cascaded to the match register 60 of level 2. If a match is found in the enabled character table at level 2, the corresponding string code is cascaded to the match register 61 of level 3. Similarly, if matches are found at levels 3 to n−1, the corresponding string codes are cascaded to next lower levels with the string code of the match from the enabled character table of level n−1 cascaded to the match register 62 of level n. If, however, a match does not occur at a level, the cascading to lower levels is terminated.

A specific protocol for performing the cascading is that when the "hit" signal is provided by the hit/miss circuit at a level, the string code of the match is cascaded to the next lower level. In the cascading process, when a hit/miss circuit at a level indicates the "miss" signal, the mismatching level is identified, terminating the cascading process. The cascading process also terminates at level n if all of the hit/miss circuits 70–73 indicate the "hit" signal.

If, at the phase 1 block 101, a mismatching level occurs, control continues with the phase 2a block 102. A mismatching level occurs when the string represented by the string code cascaded from the previous level, extended by the input character applied to the table enable decoder of the level, is not in the enabled character table at the level. Accordingly, at the block 102, the code of the string that comprises the longest match with the string in the input buffer 50 is output as the string code applied to the mismatching level from the prior level. The longest match string code is taken from the match register at the mismatching level. It is appreciated that if the mismatch should occur at level 1, the longest match is the single character string provided from the first stage of the input buffer 50 to the prefix code list of the enabled character table of level 1.

The code of the longest match, therefore, is provided by the first stage of the buffer 50 or by the match register 60–62 of the mismatching level and transferred to the longest match register 80. The code of the longest match is provided at the compressed output 12 via the code size control 81 as previously described. The mismatching character that "broke" the match is the character applied from the input buffer 50 to the table enable decoder 40–43 of the mismatching level. The logic 91 is utilized in determining the longest match.

The appropriate update extended string is entered, utilizing the logic 92, into the enabled character table of the mismatching level by entering the appropriate prefix code into the prefix code list 31 of the enabled character table. The string code is assigned to the extended string by entering the extant code from the code counter 35 into the string code field 32 of the enabled character table at the table location at which the appropriate prefix code is stored. As described above, if the mismatching level is level 1, the appropriate prefix code is taken from the first stage of the input buffer 50. If the mismatching level is one of levels 2-n, the appropriate prefix code is taken from the associated match register 60–62.

After storing the extended string, the code counter 35 is advanced to the next available string code utilizing the control input 36 and the string code size in the code size register 93 is advanced if required. Additionally, the match registers 60–62 are cleared.

The input buffer 50 is shifted entering new characters from the input 11 at the stage n+1 until the mismatching character is in the first buffer stage. The level at which the mismatch occurs determines the number of shifts to be applied by the shift control 51 to the input buffer 50. For example, if the mismatching level is level 3, three shifts are required to bring the mismatching character in the fourth stage of the buffer 50 into the first stage thereof.

It is appreciated that many of the functions of the phase 2a block 102 are simultaneously performed. The outputting of the longest match, the entering of the extended string into the enabled character table and the assigning of the string code from the code counter 35 may be concurrently executed. After the phase 2a functions of the block 102 are performed, control returns to the phase 1 block 101 to find the next longest match.

If, at the phase 1 block 101, all levels match, control proceeds from the block 101 to the phase 2b block 103. At the block 103, all levels match since at each of levels 1 to n, the string defined for matching at the level is in the enabled character table of the level. When this occurs, the n+1 character string held in the input buffer 50 is already stored in the enabled character table of level n. Accordingly, the code of the longest match is derived from the string code field 32 of the enabled character table of level n at the table location storing the string matched at level n.

The code of the longest match is provided at the compressed code output 12 via the longest match register 80 and the code size control 81 in the manner previously described. The input buffer 50 is shifted entering n+1 new characters from the input 11. The code counter 35 is advanced to the next available code utilizing the control input 36. The code size in the code size register 93 is advanced if required. The match registers 60–62 are cleared. After the functions of the phase 2b block 103 are executed, control returns to the phase 1 block 101 to find the next longest match.

It is appreciated that operations of the phase 2b block 103 are simultaneously performed. The outputting of the longest match, the shifting of the input buffer 50 and the advancing of code counter 35 may be concurrently executed.

An alternative embodiment to that of FIG. 1 may be effected by creating a character table at a level when the character corresponding to the character table is for the first time applied to the level. The table enable decoder may be configured with character indexable links to the character tables so that a character table can be created when the character corresponding thereto is first encountered and thereafter enabled by the decoder when the character corresponding thereto is again applied to the level.

A further embodiment may be effected by allocating a location to an enabled character table when the table location is required at which to store an extended string. In such an embodiment, only the memory required to store the extended strings in the character tables would be utilized.

In such embodiments, when a character table is created, the initial table location is allocated to store the first extended string therein. It is appreciated in the these embodiments that if, during a longest match iteration, a character table is created at a level, that level is the mismatching level.

Figures 4, 4A:
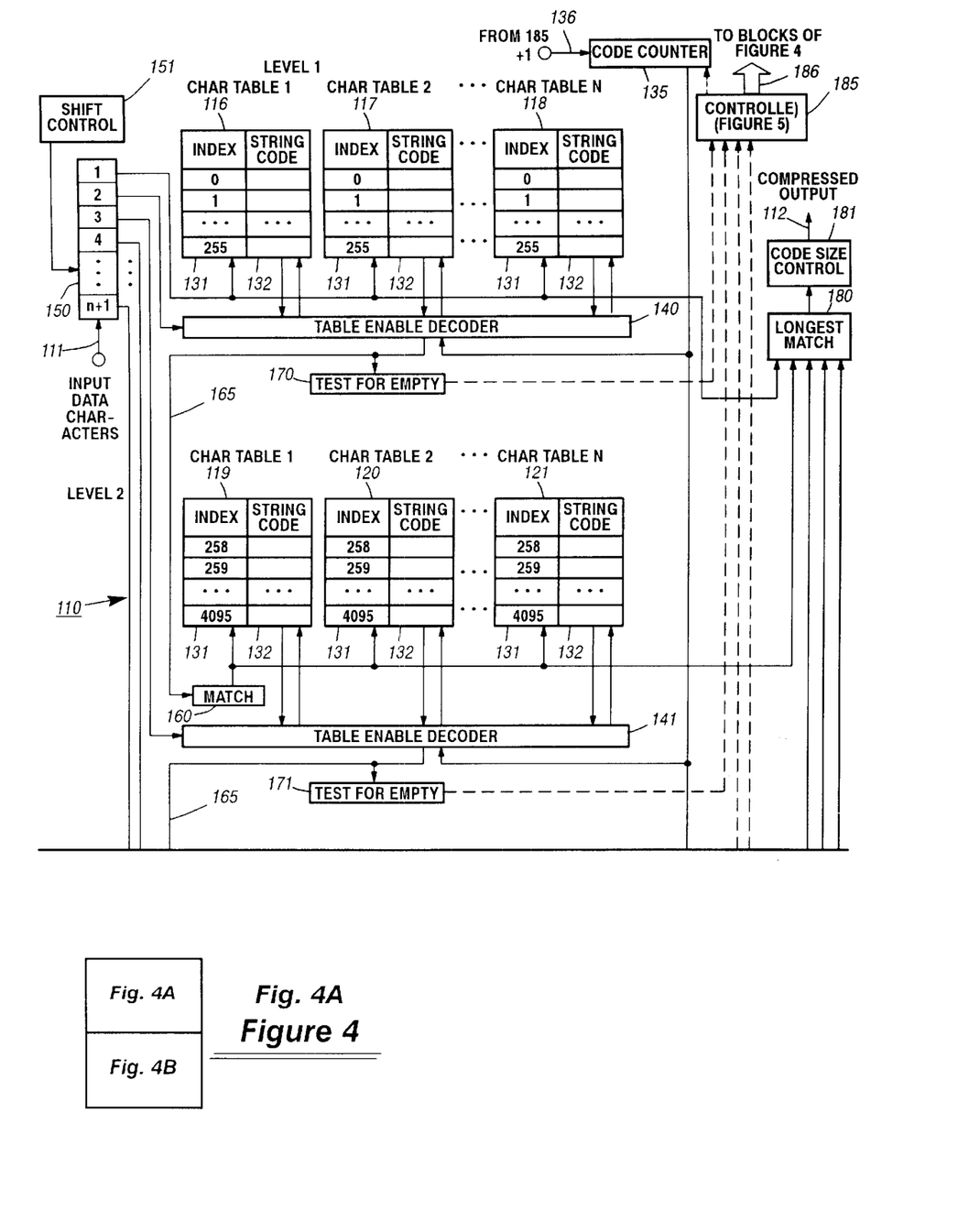
FIG. 4 is a schematic block diagram of a data compressor for compressing data in accordance with an alternative best mode embodiment of the invention.
Figures 4, 4B:
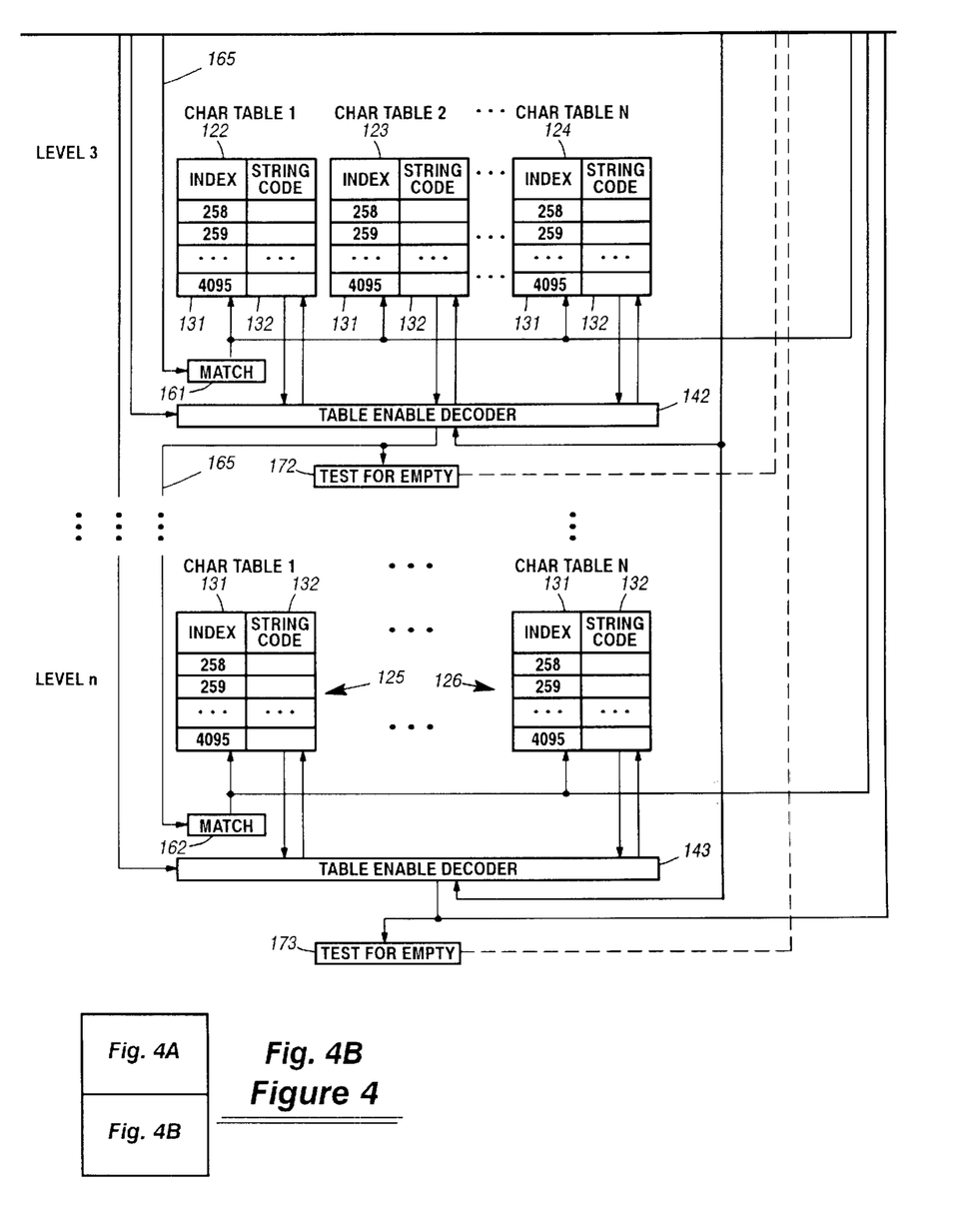
Figure 5:
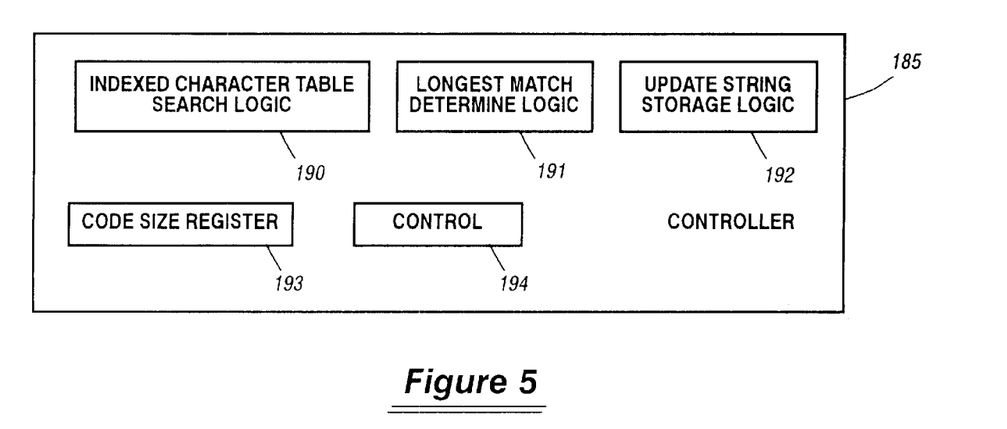
FIG. 5 is a schematic block diagram illustrating details of the controller of the embodiment of FIG. 4.

Referring to FIGS. 4 and 5, with continued reference to FIGS. 1 and 2, an alternative embodiment of the invention is illustrated. The FIG. 4 embodiment is structurally and operationally similar to the FIG. 1 embodiment and descriptions given above with respect to FIGS. 1 and 2 are generally applicable to FIGS. 4 and 5, respectively. Since numerous elements of FIGS. 4 and 5 are the same or similar to elements of FIGS. 1 and 2, an element of FIGS. 4 and 5 is given a reference numeral that is, for correlation, 100 greater than the reference numeral of the corresponding element of FIGS. 1 and 2.

Basically, the FIG. 4 embodiment differs from that of FIG. 1 in that, in the FIG. 4 embodiment, indexed character tables 116–126 are utilized at levels 1-n. A string is stored in an indexed character table by storing the string code associated with the string at a character table location indexed by the code of the string prefix in a character table corresponding to the string extension character. Inputs and outputs of respective character tables at the levels 1-n are selected by table select decoders 140–143 in accordance with the respective characters applied thereto from the stages of the input data character buffer 150.

The character tables at a level are searched by applying the appropriate prefix code to the indices 131 thereof and reading out the corresponding string codes from the string code fields 132. The string for which a search is conducted is stored in an appropriate character table if the string code is stored in the corresponding string code field thereof. The string is not contained in the character table if the corresponding string code field is empty. Accordingly, the contents of the string code field 132 for the searched string at the level is selected by the corresponding table select decoder and applied to the next level. Test for empty circuits 170–173 are utilized to determine if the searched string is stored in the selected character table at the level or if the location for the string in the selected table is empty.

The test for empty circuits 170–173 perform the function of the hit/miss circuits 70–73 of FIG. 1 in determining if a searched for string is or is not stored at a level. The string codes of strings stored in the selected character tables of the levels are cascaded from level to level until an empty location is encountered at a mismatching level. A mismatching level is identified when the string code selected by the associated table select decoder is identified as empty by the associated test for empty circuit. In a manner similar to that described above with respect to FIG. 1, the mismatching character resides in the stage of the buffer 150 coupled to the table select decoder of the mismatching level.

Thus, in the FIG. 4 embodiment, the string code of a string found in a selected character table at a level is cascaded through the table select decoder of the level to the match register 160–162 of the next level. The cascading of the string codes from level to level is terminated when the text for empty circuit at a level indicates the empty condition to the controller 185. As in the FIG. 1 embodiment, the code of the longest match is taken from the first stage of the buffer 150, from the match register 160–162 of the mismatching level, or, if all levels match, from the string code field 132 of the selected character table of level n from the character table location indexed by the code in the match register 162.

In FIG. 5, the indexed character table search logic 190, the longest match determining logic 191 and the update strings storage logic 192 perform in a manner similar to that described above with respect to the logic 90–92 of FIG. 2. Briefly, the indexed character table search logic 190 searches the character tables at the levels 1-n by applying the appropriate prefix code to the indices 131 of the character tables in order to access the indexed locations. At level 1, the appropriate prefix code utilized for indexing the character tables is the character value in the first stage of the buffer 150. At levels 2-n, the appropriate prefix codes for indexing the character tables are the codes in the respective match registers 160–162. The contents of the indexed string code fields 132 at a level are applied to the table select decoder 140–143 of the level and the selected string code field is tested for empty by the associated circuit 17014 173. If the string code field is not empty, the string code of the matched string at the level is cascaded to the match register of the next level. When the string code field is empty, the cascading is terminated and the mismatching level is identified. The longest match determining logic 191 applies the appropriate longest match code, as discussed above, to the longest match register 180. The update string storage logic 192 updates the selected character table at the mismatching level by storing the code from the code counter 135 into the string code field 132 of the character table selected by the table select decoder of the mismatching level at the table location indexed by the appropriate prefix code as discussed above.

It is appreciated that the search for the longest match protocol utilized in the FIG. 4 embodiment is predicated on finding an empty string code location at a level at a selected character table location indexed by the match register at the level. In the FIG. 1 embodiment, the hit/miss circuits were utilized to perform this function. Thus, in the FIG. 4 embodiment, the test for empty circuits 170–173 as well as the code counter 135 provide control inputs to the controller 185.

In a manner similar to that described above with respect to FIG. 1, the character tables of level 1 of FIG. 4 are indexed by the single character string codes while the character tables of levels 2-n are indexed by the multiple character string codes. Thus, for an ASCII environment, the character tables of level 1 are exemplified as indexed by the single character values 0–255 while the character tables of levels 2-n are exemplified as indexed by the multiple character string codes 258–4095.

Figure 6:
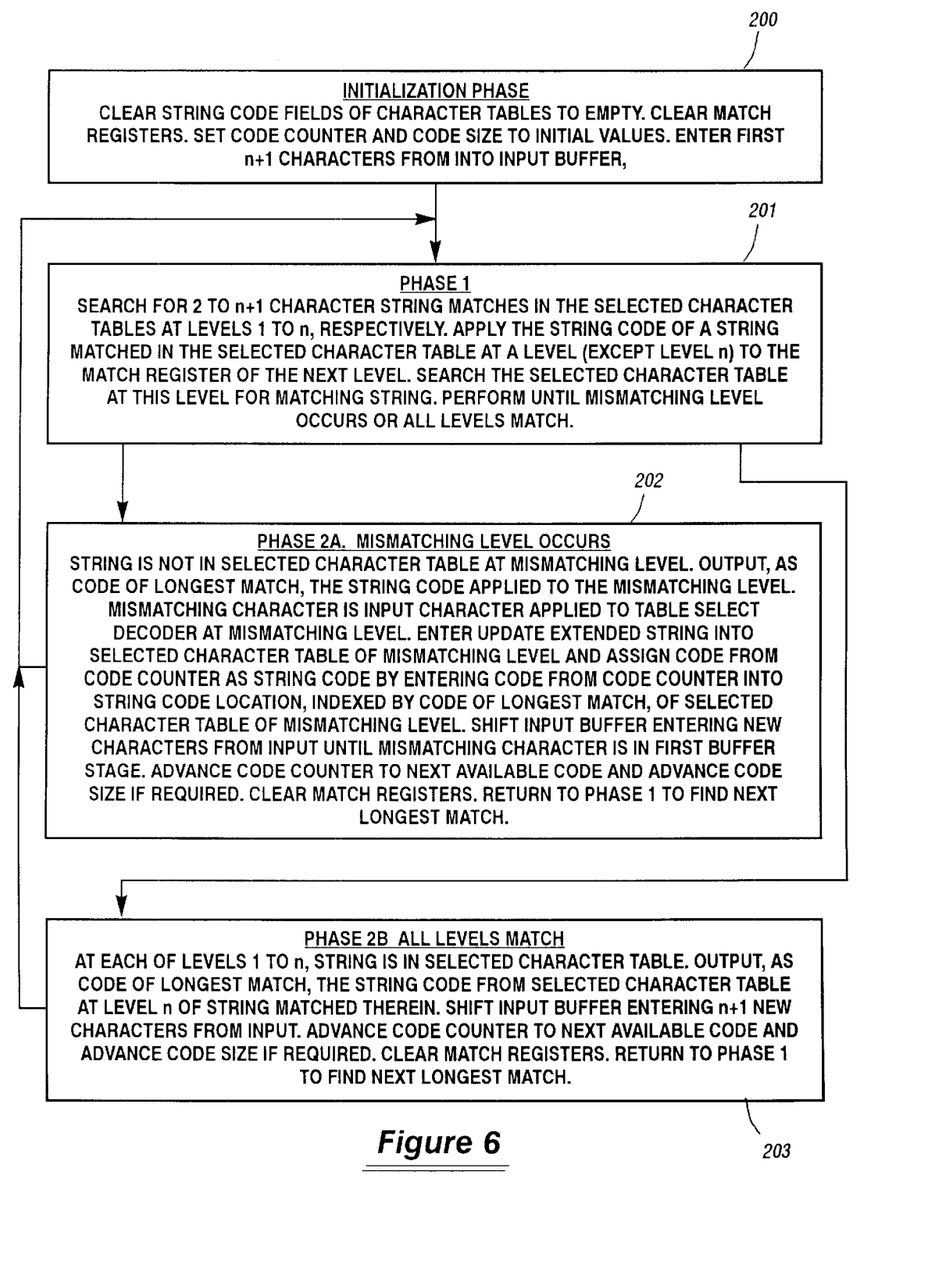
FIG. 6 is a chart, similar to FIG. 3, summarizing the functions and illustrating the operational flow of the FIG. 4 embodiment.

Referring to FIG. 6, with continued reference to FIGS. 3–5, a summary and flow diagram of the operations performed by the compressor 110 is illustrated. The flow diagram of FIG. 6 is substantially similar to that of FIG. 3 and the descriptions given above with respect to FIG. 3 are generally applicable thereto. For correlation, the blocks of FIG. 6 are given reference numerals that are 100 greater than the reference numerals of the corresponding blocks of FIG. 3.

Basically, FIG. 6 differs from FIG. 3 in that, in FIG. 6, the character tables are described as selected, as discussed above, whereas in FIG. 3 the character tables are described as enabled. Furthermore, in FIG. 6, the character table locations are indexed by prefix codes whereas, in FIG. 3, the character table locations are accessed by table look-up in prefix codes lists. Also, whereas the previous discussion of FIG. 3 is in terms of the described hit/miss operations, the operations of FIG. 6 are performed in terms of testing an indexed table location for an empty string code field. Additionally, in FIG. 6, the update extended string is entered into the character table selected at the mismatching level by storing the string code in the table location indexed by the prefix code. FIG. 6 also differs from FIG. 3 in that in block 200 of FIG. 6, the string code fields of the character tables are cleared to empty.

As described above, the FIG. 1 embodiment utilizes enabled character tables with accessed prefix code lists whereas the FIG. 4 embodiment utilizes character tables with indexed locations that are tested for empty and having inputs and outputs that are selected. It is appreciated that these configuration arrangements can be interchanged whereby character tables with selected inputs and outputs can utilize prefix code lists and character tables that are enabled can utilize indexed locations.

Figure 7:
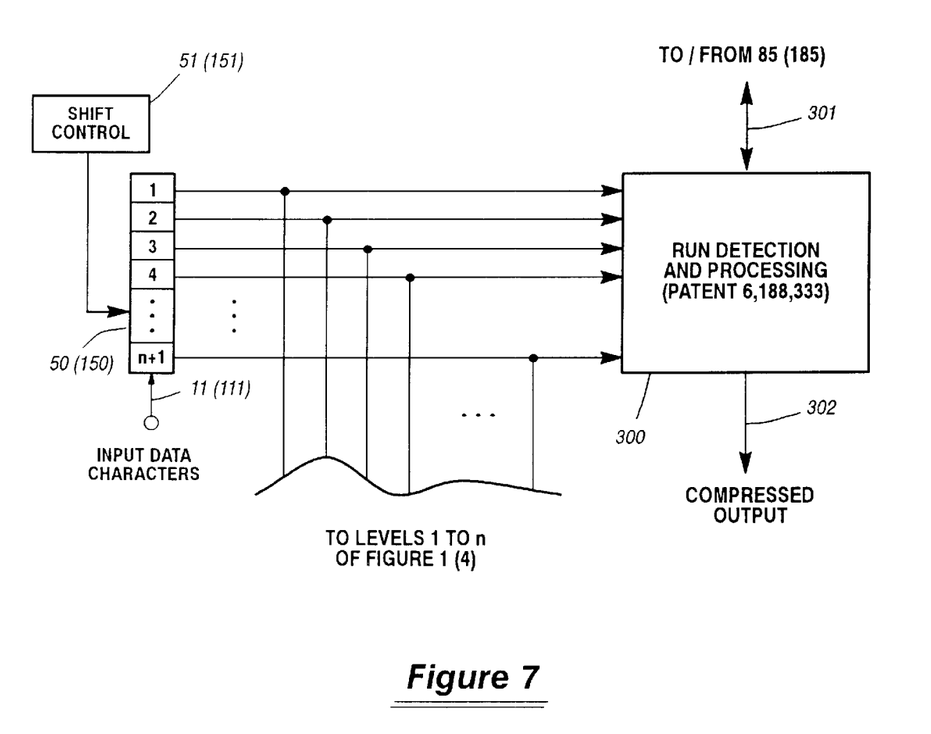
FIG. 7 is a schematic block diagram of an addition to the embodiments of FIGS. 1 and 4 for providing enhanced processing of data character runs.

Referring to FIG. 7, where like reference numerals indicate like components with respect to FIGS. 1 and 4 and with continued reference to FIGS. 1 and 4, an addition to FIG. 1 or FIG. 4 for providing enhanced processing of data character runs is illustrated. A block 300 schematically represents the run detection and processing of the compressor of said U.S. Pat. No. 6,188,333 which is incorporated herein in its entirety. The compression apparatus of the block 300 communicates with the controller 85 (185) via a bus 301 and provides compressed codes at an output 302. The compressor 300 utilizes the input buffer 50 (150) and the shift control 51 (151) to provide the input look-ahead data required by the apparatus 300. In the embodiment of FIG. 7, data character runs are processed by the apparatus 300 while non-run input data is processed by the above described embodiments.

It is believed that by utilizing the architecture of the present invention, fewer strings will be searched in determining a longest match than in conventional arrangements. For example, in the above described embodiments, only the potential matches stored in the enabled or selected character tables at the levels are searched in determining the longest matching string.

It is also believed that the implementation architecture of the present invention should result in an improvement in compressor speed. The above embodiments utilize unambiguous accessing of Character Table locations thereby eliminating the time required for collision resolution in prior art hashing implementations or prior art sibling list searches.

It is appreciated that the compressed code output provided by the above described embodiments is compatible with standard LZW decompressors and the data character stream corresponding to the compressed code can be recovered thereby. Although the above described embodiments of the invention are LZW based, it is appreciated that the architecture of the present invention can be utilized with other known dictionary based compression methodologies.

It is further appreciated that the input data characters can be over any size alphabet having any corresponding character bit size. For example, the data characters can be textual data, image pixel data or bit map data. The input data can also be binary characters over the two character binary alphabet 1 and 0 having a 1-bit size character.

In selecting the number of levels in which to implement an embodiment, the statistics of the input data can be analyzed to choose an appropriate number of levels so as to optimize performance. The number of levels can also be chosen so that there will usually be a mismatching level at which to store an extended string.

Although an appropriate string code cascading protocol is described above, the alternative protocol may be utilized to provide an additional speed enhancement. In the alternative protocol as applied to the FIG. 1 embodiment, the operations described above can be simultaneously initiated with the enabled character tables continuously searched until "hit" signals begin to occur starting with level 1. The controller 85 can examine the hits and misses determining when a final status has occurred at a mismatching level or when all of the levels match. This action may be compared to that of a "slot machine" where the different levels are spinning until they sequentially settle to a final result. This alternative protocol is also applicable to the FIG. 4 embodiment utilizing the selected character tables and test for empty circuits.

For decompressor compatibility, a maximum code limit can be imposed on the code counter 35 (135) signifying that the compressor storage is full. Such a maximum code can be 4095 as is typically utilized. When the code counter attains the maximum count, the compressor is considered as full with no further string storage occurring. A decompressor can also terminate string storage when the decompressor code counter attains the maximum code for system compatibility.

As a refinement to be incorporated into the above described embodiments, the controller 85 (185) can perform efficient operations based on the state of the compressor. For example, when the first n+1 characters are entered into the input buffer, abbreviated operations can be performed since at that point no strings are stored at any level.

It is appreciated that the above described embodiments of the invention may be implemented in hardware, firmware, software or a combination thereof. Discrete circuit embodiments may readily be implemented for performing the various described functions. In a software embodiment, appropriate modules programmed with coding readily generated from the above descriptions may be utilized.

In the appended claims, the terms "selected and selecting" are intended to generically include "enabled and enabling". In the FIG. 1 embodiment, a character table is "selected" by enabling the character table by the table enable decoder.

While the invention has been described in its preferred embodiments, it is to be understood that the words which have been used are words of description rather than of limitation and that changes may be made within the purview of the appended claims without departing from the true scope and spirit of the invention in its broader aspects.

What is claimed is:

1. Data compression apparatus for compressing an input stream of data characters into an output stream of compressed codes, said data characters being from an alphabet of data characters, comprising a plurality of character tables corresponding to respective characters of said alphabet for storing strings of data characters encountered in said input stream, said stored strings having respective string codes associated therewith, a string comprising a prefix string of at least one of said characters followed by an extension character, a string being stored by storing the string code thereof in a character table corresponding to the extension character thereof at a character table location corresponding to the code of the prefix string thereof, said character tables being arranged in levels so that the strings stored in the character tables at a level comprise one character more than the strings stored in the character tables at the level prior thereto, means for fetching a plurality of data characters from said input stream and applying respective fetched characters to said levels, means for searching said fetched characters by comparing said fetched characters to said stored strings to determine the longest match therewith, said longest match being determined by one of said fetched characters resulting in a mismatch at one of said levels, means for outputting the string code associated with said longest match so as to provide said output stream of compressed codes, and means for inserting an extended string into said character tables, said extended string comprising said longest match extended by the mismatching character, said extended string being stored at the mismatching level in a character table corresponding to said mismatching character.

2. The apparatus of claim 1 further including means for selecting one of said character tables at a level in accordance with the fetched character applied to the level, said means for searching being operative for performing said searching with respect to the strings stored in the selected character tables at said levels.

3. The apparatus of claim 2 wherein said means for searching includes means for searching the strings stored in the selected character table at a particular level for a string comprising a string matched at the level prior thereto extended by the character corresponding to the selected character table at said particular level, and means for applying the string code of a string matched at said particular level to the next level.

4. The apparatus of claim 3 wherein said means for searching is operative for determining a level whereat the selected character table at the level is not storing a string comprising the string matched at the level prior thereto extended by the character corresponding to the selected character table at the level, thereby determining said mismatching level, said string code associated with said longest match comprises the string code applied to said mismatching level from the level prior thereto, and said extended string comprises said code associated with said longest match extended by the character corresponding to the selected character table at said mismatching level.

5. The apparatus of claim 1 wherein said means for fetching comprises an input buffer for holding said plurality of data characters fetched from said input stream and for applying said fetched characters to said levels, and means for shifting said plurality of data characters in said input buffer so that the character applied to said mismatching level is shifted to a first stage of said input buffer so as to provide the first character of a next longest match.

6. The apparatus of claim 5 wherein said shifting means is operative to shift new data characters from said input stream into said input buffer.

7. The apparatus of claim 1 wherein said character tables are arranged in said levels so that the strings stored in the character tables at a level have the same number of characters with respect to each other.

8. The apparatus of claim 4 wherein a character table comprises locations including prefix codes and corresponding string codes, said prefix codes comprising a prefix code list.

9. The apparatus of claim 8 wherein said means for searching the strings stored in the selected character table at said particular level includes means for determining if the string code of a string matched at the level prior thereto is in the prefix code list of the selected character table of said particular level.

10. The apparatus of claim 9 wherein said means for searching is operative for determining said mismatching level as the level at which the prefix code list of the selected character table at the level does not include the string code of the string matched at the level prior thereto, and said inserting means includes means for inserting the string code of the string matched at the level prior thereto into the prefix code list of the selected character table at the mismatching level together with a next available string code corresponding thereto.

11. The apparatus of claim 4 wherein a character table comprises locations indexed by prefix codes for storing corresponding string codes.

12. The apparatus of claim 11 wherein said means for searching the strings stored in the selected character table at said particular level includes means for determining if the location of the selected character table of said particular level indexed by the string code of a string matched at the level prior thereto is storing a string code.

13. The apparatus of claim 12 wherein said means for searching is operative for determining said mismatching level as the level at which the location of the selected character table at the level, indexed by the string code of the string matched at the level prior thereto, is empty, and said inserting means includes means for inserting a next available string code into the empty location.

14. The apparatus of claim 2 wherein said means for selecting includes a decoder at each of said levels responsive to the fetched character applied to the level for enabling a character table at the level corresponding to the fetched character.

15. The apparatus of claim 2 wherein said means for selecting includes a decoder at each of said levels responsive to the fetched character applied to the level for selecting the inputs and outputs of a character table at the level corresponding to the fetched character.

16. The apparatus of claim 4 wherein said means for fetching comprises an input buffer having a plurality of stages for holding said plurality of data characters fetched from said input stream and for applying said fetched characters to said levels, said plurality of stages including a first stage and a second stage for holding a two character string for searching in the selected character table of said first level, and means for shifting said plurality of data characters in said stages so that the character applied to said mismatching level is shifted to said first stage so as to provide the first character of a next longest match.

17. The apparatus of claim 16 wherein said levels include a first level and said means for searching comprises means for searching the strings stored in the selected character table at said first level for a two character string comprising the characters held in said first and second stages of said input buffer, the character held in said first stage comprising the prefix string of said two character string.

18. The apparatus of claim 17 wherein, if said mismatching level is said first level, said searching means is operative in providing the string code associated with said longest match as the code of the prefix of said two character string not matched in the selected character table at said first level.

19. The apparatus of claim 1 wherein said means for fetching comprises an input buffer for holding said plurality of data characters fetched from said input stream and for applying said fetched characters to said levels, said apparatus further including run detection and processing means responsive to the data characters held in said input buffer for detecting a data character run in said input stream and providing an output stream of compressed codes corresponding to said run.

20. Data compression apparatus for compressing an input stream of data characters into an output stream of compressed codes, said data characters being from an alphabet of data characters, comprising a plurality of character tables corresponding to respective characters of said alphabet for storing strings of data characters encountered in said input stream, said stored strings having respective string codes associated therewith, a string comprising a prefix string of at least one of said characters followed by an extension character, a string being stored by storing the string code thereof in a character table corresponding to the extension character thereof at a character table location corresponding to the code of the prefix string thereof, said character tables being arranged in levels so that the strings stored in the character tables at a level comprise one character more than the strings stored in the character tables at the level prior thereto, said levels including a last level, means for fetching a plurality of data characters from said input stream and applying respective fetched characters to said levels, means for selecting one of said character tables at each of said levels in accordance with the fetched character applied to the level, means for searching said fetched characters by comparing said fetched characters to the strings stored in the selected character tables to determine the longest match therewith, said means for searching being operative for searching the strings stored in the selected character table at a particular level for a string comprising a string matched at the level prior thereto extended by the character corresponding to the selected character table at said particular level and for applying the string code of a string matched at said particular level to the next level, said longest match being determined by matching the plurality of fetched data characters with a string stored in the selected character table at said last level, and means for outputting the string code associated with the string matched in the selected character table at said last level so as to provide said output stream of compressed codes.

21. A data compression method for compressing an input stream of data characters into an output stream of compressed codes, said data characters being from an alphabet of data characters, comprising storing strings of data characters encountered in said input stream in a plurality of character tables corresponding to respective characters of said alphabet, said stored strings having respective string codes associated therewith, a string comprising a prefix string of at least one of said characters followed by an extension character, a string being stored by storing the string code thereof in a character table corresponding to the extension character thereof at a character table location corresponding to the code of the prefix string thereof, said character tables being arranged in levels so that the strings stored in the character tables at a level comprise one character more than the strings stored in the character tables at the level prior thereto, fetching a plurality of data characters from said input stream and applying respective fetched characters to said levels, searching said fetched characters by comparing said fetched characters to said stored strings to determine the longest match therewith, said longest match being determined by one of said fetched characters resulting in a mismatch one of said levels, outputting the string code associated with said longest match so as to provide said output stream of compressed codes, and inserting an extended string into said character tables, said extended string comprising said longest match extended by the mismatching character, said extended string being stored at the mismatching level in a character table corresponding to said mismatching character.

22. The method of claim 21 further including selecting one of said character tables at a level in accordance with the fetched character applied to the level, said searching step including searching with respect to the strings stored in the selected character tables at said levels.

23. The method of claim 22 wherein said searching steps includes searching the strings stored in the selected character table at a particular level for a string comprising a string matched at the level prior thereto extended by the character corresponding to the selected character table at said particular level, and applying the string code of a string matched at said particular level to the next level.

24. The method of claim 23 wherein said searching step includes determining a level whereat the selected character table at the level is not storing a string comprising the string matched at the level prior thereto extended by the character corresponding to the selected character table at the level, thereby determining said mismatching level, said string code associated with said longest match comprises the string code applied to said mismatching level from the level prior thereto, and said extended string comprises said code associated with said longest match extended by the character corresponding to the selected character table at said mismatching level.

25. The method of claim 21 wherein said fetching step comprises providing an input buffer for holding said plurality of data characters fetched from said input stream and for applying said fetched characters to said levels, and shifting said plurality of data characters in said input buffer so that the character applied to said mismatching level is shifted to a first stage of said input buffer so as to provide the first character of a next longest match.

26. The method of claim 25 wherein said shifting step includes shifting new data characters from said input stream into said input buffer.

27. The method of claim 21 wherein said character tables are arranged in said levels so that the strings stored in the character tables at a level have the same number of characters with respect to each other.

28. The method of claim 24 wherein a character table comprises locations including prefix codes and corresponding string codes, said prefix codes comprising a prefix code list.

29. The method of claim 28 wherein said step of searching the strings stored in the selected character table at said particular level includes determining if the string code of a string matched at the level prior thereto is in the prefix code list of the selected character table of said particular level.

30. The method of claim 29 wherein said searching step includes determining said mismatching level as the level at which the prefix code list of the selected character table at the level does not include the string code of the string matched at the level prior thereto, and said inserting step includes inserting the string code of the string method at the level prior thereto into the prefix code list of the selected character table at the mismatching level together with a next available string code corresponding thereto.

31. The method of claim 24 wherein a character table comprises locations indexed by prefix codes for storing corresponding string codes.

32. The method of claim 31 wherein said step of searching the strings stored in the selected character table at said particular level includes determining if the location of the selected character table of said particular level indexed by the string code of a string matched at the level prior thereto is storing a string code.

33. The method of claim 32 wherein said searching step includes determining said mismatching level as the level at which the location of the selected character table at the level, indexed by the string code of the string matched at the level prior thereto, is empty, and said inserting step includes inserting a next available string code into the empty location.

34. The method of claim 22 wherein said step of selecting includes providing a decoder at each of said levels responsive to the fetched character applied to the level for enabling a character table at the level corresponding to the fetched character.

35. The method of claim 22 wherein said step of selecting includes providing a decoder at each of said levels responsive to the fetched character applied to the level for selecting the inputs and outputs of a character table at the level corresponding to the fetched character.

36. The method of claim 24 wherein said fetching step comprises providing an input buffer having a plurality of stages for holding said plurality of data characters fetched from said input stream and for applying said fetched characters to said levels, said plurality of stages including a first stage and a second stage for holding a two character string for searching in the selected character table of said first level, and shifting said plurality of data characters in said stages so that the character applied to said mismatching level is shifted to said first stage so as to provide the first character of a next longest match.

37. The method of claim 36 wherein said levels include a first level and said searching step comprises searching the strings stored in the selected character table at said first level for a two character string comprising the characters held in said first and second stages of said input buffer, the character held in said first stage comprising the prefix string of said two character string.

38. The method of claim 37 wherein, if said mismatching level is said first level, said searching step includes providing the string code associated with said longest match as the code of the prefix of said two character string not matched in the selected character table at said first level.

39. A data compression method for compressing an input stream of data characters into an output stream of compressed codes, said data characters being from an alphabet of data characters, comprising storing strings of data characters encountered in said input stream in a plurality of character tables corresponding to respective characters of said alphabet, said stored strings having respective string codes associated therewith, a string comprising a prefix string of at least one of said characters followed by an extension character, a string being stored by storing the string code thereof in a character table corresponding to the extension character thereof at a character table location corresponding to the code of the prefix string thereof, said character tables being arranged in levels so that the strings stored in the character tables at a level comprise one character more than the strings stored in the character tables at the level prior thereto, said levels including a last level, fetching a plurality of data characters from said input stream and applying respective fetched characters to said levels, selecting one of said character tables at each of said levels in accordance with the fetched character applied to the level, searching said fetched characters by comparing said fetched characters to the strings stored in the selected character tables to determine the longest match therewith, said searching step includes searching the strings stored in the selected character table at a particular level for a string comprising a string matched at the level prior thereto extended by the character corresponding to the selected character table at said particular level and for applying the string code of a string matched at said particular level to the next level, said longest match being determined by matching the plurality of fetched data characters with a string stored in the selected character table at said last level, and outputting the string code associated with the string matched in the selected character table at said last level so as to provide said output stream of compressed codes.

\* \* \* \* \*